US008278638B2

(12) United States Patent
Gidon et al.

(10) Patent No.: US 8,278,638 B2
(45) Date of Patent: Oct. 2, 2012

(54) DEVICE FOR STORING DATA WITH OPTICAL ADDRESSING

(75) Inventors: Serge Gidon, La Murette (FR); Bérangère Hyot, Eybens (FR)

(73) Assignee: Commissariat a l'Energie Atomique, Paris (FR)

( * ) Notice: Subject to any disclaimer, the term of this patent is extended or adjusted under 35 U.S.C. 154(b) by 329 days.

(21) Appl. No.: 12/540,796

(22) Filed: Aug. 13, 2009

(65) Prior Publication Data
US 2010/0051894 A1 Mar. 4, 2010

(30) Foreign Application Priority Data
Aug. 29, 2008 (FR) ...................................... 08 55807

(51) Int. Cl.
*H01L 47/00* (2006.01)
(52) U.S. Cl. ............. 257/2; 257/3; 257/4; 257/E47.001; 438/95; 365/163
(58) Field of Classification Search ......... 257/2; 438/95
See application file for complete search history.

(56) References Cited

U.S. PATENT DOCUMENTS

| 5,179,533 | A | 1/1993 | Bullington et al. |
| 5,596,522 | A * | 1/1997 | Ovshinsky et al. ............ 365/113 |
| 6,808,743 | B2 | 10/2004 | Petrella et al. |
| 7,018,757 | B2 | 3/2006 | Zhu et al. |
| 7,335,907 | B2 * | 2/2008 | Terao et al. ........................ 257/2 |
| 2003/0179684 | A1 | 9/2003 | Gidon |
| 2006/0056277 | A1 | 3/2006 | Poupinet et al. |
| 2006/0136956 | A1 | 6/2006 | Poupinet et al. |
| 2006/0182924 | A1 | 8/2006 | Cornu et al. |
| 2007/0085788 | A1* | 4/2007 | Harada et al. .................... 345/84 |
| 2008/0149992 | A1 | 6/2008 | Gidon |
| 2008/0267048 | A1 | 10/2008 | Poupinet et al. |
| 2008/0273447 | A1 | 11/2008 | Hyot et al. |
| 2009/0181205 | A1 | 7/2009 | Poupinet et al. |

FOREIGN PATENT DOCUMENTS

| EP | 1 968 117 A2 | 9/2008 |
| FR | 2 813 139 A1 | 2/2002 |
| FR | 2 906 925 A1 | 4/2008 |
| FR | 2 910 686 A1 | 6/2008 |
| FR | 2 912 539 A1 | 8/2008 |
| FR | 2 914 775 A1 | 10/2008 |

(Continued)

OTHER PUBLICATIONS

Bedeschi et al; "4-Mb MOSFET-Selected u Trench Phase-Change Memory Experimental Chip", IEEE J. Solid-State Circuits, vol. 40, No. 7 Jul. 2005.

(Continued)

*Primary Examiner* — Jerome Jackson, Jr.
(74) *Attorney, Agent, or Firm* — Pearne & Gordon LLP

(57) ABSTRACT

A data storage device including a stack of layers is provided. The stack of layers includes at least one memory layer able to effect a storage of data in a plurality of portions of the memory layer by a modification of at least one physico-chemical property of the material of the portions of the memory layer under the effect of an electric current passing through the portions of the memory layer. A plurality of photoconductive columns disposed in the stack of layers passes through each layer in this stack. Each of the portions of the memory layer surrounds one of the photoconductive columns.

16 Claims, 5 Drawing Sheets

FOREIGN PATENT DOCUMENTS

| FR | 2 882 851 A1 | 9/2009 |
|---|---|---|
| FR | 2 929 747 A1 | 10/2009 |

OTHER PUBLICATIONS

Vettiger et al; "The "Millipede"—More Than One Thousand Tips for Future AFM Data Storage", IBM J. Res. Develop, vol. 44, No. 3, May 2000, pp. 323-340.

Fukuzumi et al; "Optimal Integration and Characteristics of Vertical Array Devices for Ultra-High Density, Bit-Cost Sealable Flash Memory", 2007 IEEE, pp. 449-452.

Gidon et al; "Electrical Probe Storage Using Joule Heating in Phase Change Media", Applied Physics Letters, vol. 85, No. 26, Dec. 27, 2004, pp. 6392-6394.

Kim et al; "Fabrication of Micro-Pyramidal Probe Array with Aperture for Near-Field Optical Memory Applications", Japanese Journal of Applied Physics, vol. 39, 2000, pp. 1538-1541.

Goto et al; "Microoptical Two-Dimensional Devices for the Optical Memory Head of an Ultrahigh Data Transfer Rate and Density System Using a Vertical Cavity Surface Emitting Laser (VCSEL) Array", Japanese Journal of Applied Physics, vol. 41, 2002, pp. 4835-4840.

Hou et al; "Chemical Vapor Deposition of Epitaxial Zinc Oxide Thin Films on Gallium NItrade/Sapphire Substrates", Phys. Stat. Sol. (c) 1, No. 4, 2004. pp. 586-859.

Shinada et al; "Fabrication of Micro-Aperture Surface Emitting Laser for Near Field Optical Data Storage", Japanese Journal of Applied Physics, vol. 38, 1999, pp. L1327-1329.

French Search Report dated Feb. 16, 2009.

\* cited by examiner

DEVICE FOR STORING DATA WITH OPTICAL ADDRESSING

TECHNICAL FIELD

The invention concerns a device for storing data with optical addressing with writing, reading and deletion of data by photoelectric effect. The invention also concerns a method of producing such a device.

PRIOR ART

Computing or multimedia applications are requiring greater and greater memory capacities, whether for the exchange of data or for the hard disk substitution market. There exist several types of memory devices for recording data, such as for example mass memories (hard disks (SSDs or "Solid State Drives") or optical disks) or static memories (Flash memories, PCRAMs, FeRAMs, etc), also called solid memories since no moving mechanical element is used.

The document "4-Mb MOSFET Selected µTrench Phase-Change Memory Experimental Chip" by F Bedeschi et al, IEEE J. Solid-State Circuits, vol. 40, No 7, July 2005, discloses a memory based on a phase-change material (also referred to as a PCRAM memory), the functioning of which is based on a modification of the crystallinity state of a volume of phase-change material (a chalcogenide), countersunk, or set, between two electrodes. The change from one phase to another, that is to say from the crystalline state to the amorphous state or vice versa, of the chalcogenide is obtained by Joule heating, by means of a more or less great current pulse. The state of the memory may then be detected by reading the resistance of the volume of phase-change material, which is different depending on whether the material is in an amorphous state or in a crystalline state.

However, with this type of memory, the increases in storage capacity are related solely to the increase in the density of surface integration of the storage elements, which is related to the reduction in the size of the storage elements. In addition, in order to effectively access the data, the access bus must be designed so as to minimise the electromagnetic couplings during addressing in order to accept ever higher operating frequencies in order to have a short access time, which could pose problems during subsequent developments in the integration of such memories.

There also exist so-called "microspike memories" comprising a storage medium addressed by means of an array of movable microspikes. These microspikes locally modify the physico-chemical properties (for example mechanical, thermal or electrical) of the surface of the storage medium in order to write information thereon. This information may then be read by detection of the modifications of the physico-chemical properties produced on the surface of the medium. In this type of memory, the ends of the microspikes define the limit of the surface density of the storage elements. The surface density obtained (for example between 0.1 Tbits/cm$^2$ and 0.5 Tbits/cm$^2$) predisposes these memories to large-capacity applications in a small volume, for example intended for nomadic devices. Moreover, since their manufacturing technology does not require advanced lithographic means, their manufacturing cost remains fairly low.

The document "The "Millipede"—More than one thousand tips for the future AFM data storage" by P Vettiger et al, IBM J. Res. Develop., vol. 44, No 3, May 2000, pages 323 to 340, discloses a microspikes memory using atomic force microscopy (AFM) techniques on the surface of a storage layer based on polymer materials. The information stored in this memory is in the form of holes produced in the storage layer.

However, given their functioning, microspike memories require electrical and mechanical contact of the microspikes with the surface of the storage medium. However, such contact involves wear on the spikes and storage medium, which represents a source of problems for the reliability of the device over time. In addition, the size of the end of the microspike may limit the integration density of the memory elements since the minimum size of the end of the microspike is greater than the size of the data storage locations.

3D integration solutions in which memory layers are stacked are also known. However, these solutions have recourse to diode or transistor structures for electrically insulating the memory layers from each other. Such structures introduce technological complications that may impair the optimisation of the integration density in the memory device.

DISCLOSURE OF THE INVENTION

Thus there is a need to propose a data storage device with stacked memory layers having better reliability than the devices of the prior art, and the structure of which does not involve the presence of insulation elements between the memory layers that may impair optimisation of the integration density in the device.

For this purpose, one embodiment of the present invention proposes a data storage device comprising:
  a stack of layers comprising at least one memory layer able to implement, or effect, data storage in a plurality of portions of the memory layer by modification of at least one physico-chemical property of the material of said portions of the memory layer under the effect of an electric current passing through said portions of the memory layer;
  a plurality of photoconductive columns disposed in the stack of layers and passing through each layer in this stack;
  each of said portions of the memory layer surrounding one of the photoconductive columns.

Thus a media memory device, or storage medium, is proposed comprising at least one stack of layers formed by at least one memory layer, for example disposed between two insulating layers. Storage in the memory medium is therefore controlled optically by means of the photoconductive columns when at least one of them is illuminated.

"Photoconductive column" means a column formed from one or more materials and able to become electrically conductive under the effect of optical illumination. This therefore covers all the effects with creation of electron-hole pairs that lead to the creation of majority carriers or the associated compensation of minority carriers, from a light illumination of these columns, in the material or materials of these columns.

Because the columns are photoconductive, such a device has recourse not to an array of movable microspikes but to an array of light sources for addressing thereof, thus avoiding the constraints related to such microspikes.

In addition, the structure in a stack of layers makes it possible best to profit from a three-dimensional integration of the storage circuits, by producing a stack of memory points, allowing an easy increase in the storage capacity. It is therefore possible to obtain, with such a device, very large storage capacities at low cost, in a reduced volume, without extending the surface of each memory layer.

In addition, when the stack of layers comprises several memory layers, this device has the advantage of being able to continue to function even if one or more of the memory layers are faulty, by virtue of the other memory layers in the stack.

Such a device also makes it possible to reduce transient currents associated with stray capacitances between the memory layers generally appearing in the memory devices of the prior art comprising a stack of memory layers.

Finally, given that only the illuminated column becomes electrically conductive, such a device does not require an electrical insulation structure between the memory layers since the non-illuminated columns remain electrically insulating, no operation of writing, deleting or reading data being able to take place at a memory point other than that or those chosen by the user.

Said portions of the memory layer may be annular in shape.

The photoconductive columns may be based on at least one photoconductive material. This photoconductive material may be undoped silicon and/or zinc oxide and/or indium antimonide and/or an alloy of tellurium antimony germanium ($Ge_xSb_yTe_z$) and/or an organic photoconductive material.

In a variant, the photoconductive columns may comprise at least two semiconducting layers with complementary conductivities, that is to say one p type and the other n type. The photoconductive columns thus form p-n or PIN photodiodes. The photoconductive columns may also comprise a layer of doped semiconductor and a metal layer, thus forming Schottky photodiodes.

The device may also comprise a plurality of light sources able to illuminate said plurality of photoconductive columns.

Said memory layer may be based on at least one phase-change material. Thus the writing, deletion and reading of the data are achieved by means of the crystallinity state of the memory points of the memory layer, these memory points might be annular portions of the memory layer disposed around the photoconductive columns.

The stack of layers may be formed by an alternation of insulating layers and memory layers.

The data storage device may also comprise a plurality of trenches produced in the stack of layers and passing through all the layers in the stack, forming several portions, electrically insulated from one another, of the stack of layers and photoconductive columns.

The device may also comprise at least one electrically conductive layer disposed against, or in direct contact with, the stack of layers and against, or in direct contact with, the top or base of the photoconductive columns. It is possible that, in place of this electrically conductive layer, the device may comprise other means for forming a source electrode or a collecting charges electrode participating in the circulation of an electric current through the storage portions of the memory layer, for example conductive pins formed against the base of each of the columns and all connected to the same electrical potential, or a conductive optical microspike.

The device may also comprise means of applying voltage to the terminals of the memory layer and/or means of selecting one or more photoconductive columns and/or means of selecting one or more memory layers, and/or means of measuring current flowing in one or more memory layers. Thus the various selection means may form control electronics able to select the portion or portions of the memory layer at which an operation (reading, writing or deletion) is intended to be performed. The current measuring means may form means of reading information stored in the memory layers.

The plurality of light sources may comprise an array of optical sources of the VCSEL type.

The device may also comprise at least one optically reflective layer, for example such that the stack of layers is disposed between the optically reflective layer and the plurality of light sources, and/or at least one protection layer formed on the stack of layers. The device may also comprise at least one optically reflective layer and/or at least one protection layer formed against, or in direct contact with, the stack of layers.

At least the stack of layers and the photoconductive columns may form a storage medium able to move with respect to the plurality of light sources. In addition, the device may comprise means for relatively moving the storage medium with respect to the plurality of light sources.

The plurality of light sources may be disposed in a system of the MOEMS type (micro-opto-electro-mechanical system) able to translate the light sources with respect to the storage medium, and/or the means for relatively moving the storage medium with respect to the plurality of light sources comprising at least one motor of the MEMS type (microelectromechanical system).

Another embodiment of the invention also concerns a method of producing a data storage device, comprising at least the steps of producing a stack of layers comprising at least one memory layer able to implement a storage of data in a plurality of portions of the memory layer by modifying at least one physico-chemical property of the material of said portions of the memory layer under the effect of an electric current passing through said portions of the memory layer;

etching a plurality of holes in the stack of layers, the holes passing through each layer in the stack;

producing photoconductive columns in the holes, each of said portions of the memory layer surrounding one of the photoconductive columns.

The method may also comprise a step of producing a plurality of light sources able to illuminate the plurality of photoconductive columns.

Production of the stack of layers may be obtained by steps of alternating depositions of insulating layers and memory layers.

The method may also comprise, after the production of the stack of layers, a step of producing a plurality of trenches in the stack, passing through all the layers in the stack and forming several portions insulated from one another of the stack of layers.

The step of producing the photoconductive columns may also comprise the production of photodiodes at the interfaces with the memory layer.

The step of producing the photoconductive columns comprises a step of filling the holes with at least one photoconductive material, or a first step of conformal deposition at the walls of the holes of a first layer based on a doped semiconductor with a first type of conductivity and a second step of depositing a doped semiconductor with a second type of conductivity complementary to the first type of conductivity or of an electrically conductive material on the first layer.

The production of the columns may be obtained by implementing at least a first step of conformal deposition of a layer of photoconductive material in the holes, and a second step of deposition of a conductive material in the holes, against the layer of photoconductive material.

The method may also comprise, after the step of producing the columns, a step of deposition of an electrically conductive layer and/or of a mechanical protection layer on the stack of layers and on the photoconductive columns.

The method may also comprise, before the step of producing the stack of layers, a step of depositing an electrically conductive layer and/or at least one optically reflective layer against a substrate, the stack of layers being produced on the electrically conductive layer and/or on the optically reflective layer.

BRIEF DESCRIPTION OF THE DRAWINGS

The present invention will be better understood from a reading of the description of example embodiments given purely indicatively and in no way limitatively, referring to the accompanying drawings, on which.

Identical, similar or equivalent parts in the various figures described below bear the same numerical reference signs so as to facilitate passing from one figure to another.

The various parts shown in the figures are not necessarily shown according to a uniform scale, in order to make the figures more legible.

The various possibilities (variants and embodiments) must be understood as not being exclusive of one another and may be combined with one another.

DETAILED DISCLOSURE OF PARTICULAR EMBODIMENTS

Figure 1:
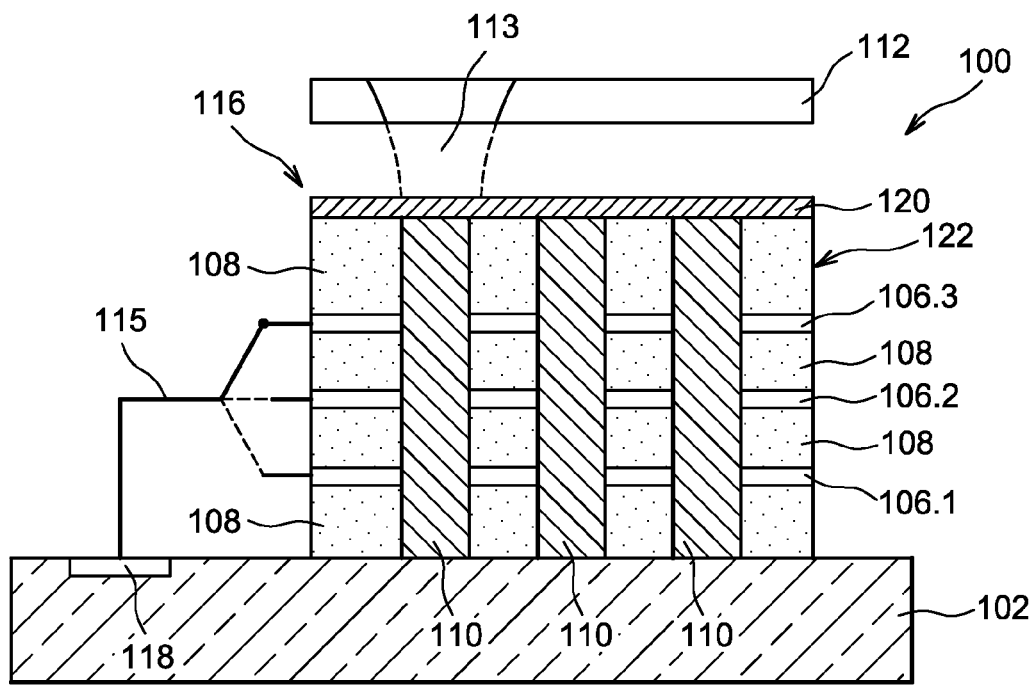
FIGS. 1 and 2 show views in section of part of a data storage device respectively according to a first and a second embodiment.

Reference is made first of all to FIG. 1, which shows a view in section of part of a data storage device 100 according to a first embodiment.

The device 100 comprises a substrate 102, for example based on a semiconductor such as silicon, and/or glass and/or plastic such as PMMA (polymethyl methacrylate).

The device 100 also comprises several memory layers 106 in which the data are intended to be stored. In this first embodiment, these memory layers 106 are based on a phase-change material, that is to say a material whose electrical conduction properties are modifiable, and stacked on the substrate 102. The memory layers 106 may for example be based on at least one material in the chalcogenide family, for example GeSe, and advantageously ternary chalcogenides such as $Ge_xSb_yTe_z$ (for example $Ge_2Sb_2Te_5$) and/or $Ag_xIn_ySb_zTe_t$.

In FIG. 1, only three layers 106.1 to 106.3 are shown. However, the device 100 may comprise a different number of memory layers 106, for example eight memory layers, or between two and ten memory layers, or even more.

These layers 106 are called "memory layers" and are isolated mechanically, electrically and thermally from one another and from the substrate 102 by insulating layers 108, or dielectric layers, based on a material such as silica and/or silicon nitride and/or zinc sulphide and/or silicon oxide, and with a thickness of between approximately 10 nm and 100 nm. Because of the low thermal conductivity of the material of the insulating layers 108 (for example approximately 0.6 $W \cdot m^{-1} \cdot K^{-1}$ for a compound of ZnS and $SiO_2$), these therefore form a good thermal insulator between the memory layers 106 so that the heat generated in one of these memory layers 106 cannot propagate into the other memory layers 106.

When the device 100 is produced, the material of the memory layers 106 may be in crystalline phase. The memory layers 106 may for example have a thickness of between approximately 1 nm and 30 nm, and advantageously between approximately 2 nm and 10 nm, and in particular between approximately 3 nm and 5 nm. In particular, when the material of the memory layers 106 is in the chalcogenide family, the thickness of the memory layers 106 is chosen by making a compromise between a reduced thickness making it possible to increase the confinement of the current lines in these layers, and a sufficient thickness for the material to be able to change state.

In this first embodiment, each memory layer 106 is disposed between two insulating layers 108. In general terms, the device 100 may comprise at least one memory layer disposed between two insulating layers. When the device 100 comprises several memory layers, each memory layer is disposed between two insulating layers.

The device 100 also comprises several photoconductive columns 110. In this first embodiment, the photoconductive columns 110 are based on a photoconductive material such as undoped silicon and/or zinc oxide and/or an organic photoconductive material (OPC). These columns 110 pass, for example perpendicularly, through the memory layers 106 and the insulating layers 108. In FIG. 1, only three photoconductive columns 110 are shown. These columns 110 may for example have a substantially cylindrical shape and have dimensions substantially similar to one another. In the example in FIG. 1, the columns 110 are regularly spaced apart from one another, for example by distance of at least approximately 200 nm, this distance being chosen so as to be compatible with the resolution of optical selection means intended to illuminate the columns 110. The columns 110 have for example a circular cross section with a diameter of approximately 100 nm or more generally approximately equal to the spacing between these columns. However, it is possible for the cross-sections of the columns to have different forms, for example rectangular, triangular or any other geometric shape and/or with different dimensions.

The memory layers 106 and the insulating layers 108 may be structured in several "compartments" or portions, disposed on the substrate 102 and isolated from one another by a vacuum and/or an insulating material. In the example in FIG. 1, a single compartment 116 comprising the memory layers 106.1 to 106.3 and the insulating layers 108 is shown. Each compartment 116 may for example comprise between approximately 1,000 and 100,000,000 photoconductive columns.

Each portion, for example annular in shape, of memory layers 106 surrounding a photoconductive column 110 forms a storage element, or memory point, of the device 100, in which information is written, read and deleted.

The device 100 of FIG. 1 also comprises an electrically conductive layer 120, forming an electrode, a source of or for collection of charges, disposed against the stack of memory layers 106 and insulating layers 108, and against the tops of the columns 110. This electrically conductive layer 120 is for example based on ITO (indium-tin oxide) and/or a metal (for example gold and/or titanium and/or platinum) and/or titanium nitride and/or conductive metal compounds such as silicide (for example PtSi) or carbon (with an sp3/sp2 proportion such that this carbon is conductive). This layer 120 has a thickness of between approximately 1 nm and 10 nm, so that its conductivity allows the passage of a current between this electrode layer 120 and one of the columns 110 at which a data storage operation is intended to be performed. In addition, this electrically conductive layer 120 is optically transparent. This transparency may be obtained by producing the electrically conductive layer 120 such that its thickness is between approximately 1 nm and 10 nm, preferably between approximately 3 nm and 10 nm. The electrical resistance presented by the electrically conductive layer 120 is less than or equal to approximately 100 kΩ. The conductivity of the layer 120, when this is based on carbon, is between 0.1 (Ω·cm)$^{-1}$ and 1 (Ω·cm)$^{-1}$.

In a variant of this first embodiment, the conductive layer 120 might be disposed between the substrate 102 and the first insulating layer 108, that is to say under and against the stack of layers 106, 108, and against the base of the columns 110.

Thus the stack of memory layers 106, the insulating layers 108, the substrate 102 and the electrically conductive layer 120, and the photoconductive columns 110, form a storage medium 122 of the device 100.

The device 100 also comprises means 115 of selecting memory layers 106, which may be associated with means of applying voltage to the terminals of the memory layers 106, such as an addressing circuit, fixing for example the potential of one of the memory layers 106 in which information is intended to be read and/or written. This potential may for example be low when a reading operation is performed, high during a writing operation, and even higher for a deletion operation. This potential applied is for example between approximately 0.5 V and 8 V. In this range of values, the reading operation may be performed with a voltage of between approximately 0.5 V and 1 V, the writing operation with a voltage of between approximately 2 V and 4 V and the deletion operation with a voltage of between approximately 5 V and 8 V.

The device 100 also comprises an array of optical sources 112, produced for example in VCSEL technology (Vertical Cavity Source Emission Laser). This array of optical sources 112 makes it possible to produce very localised near-field light emissions, but also in far field by interposing an array of microlenses, thus making it possible to individually illuminate the column or columns 110 in which data storage operations (reading, writing or deletion of data) are intended to be performed, and thus to make these columns 110 electrically conductive when they are illuminated.

In a variant the array of optical sources 112 might be disposed under the substrate 102, when the latter is transparent to the wavelengths emitted by this array of optical sources 112, the light beams passing through the substrate 102 before reaching the columns 110. It might also be integrated in the substrate 102 so that a light emission is effected from the base of the columns 110.

The device 100 also comprises current measurement means 118, disposed at the substrate 102. In the example in FIG. 1, the current measuring means 118 are connected to the memory layer selection means 115. The current measuring means 118 may comprise logic address selection means such as a multiplexer, taking account of the compartment structure of the memory layers 106 and insulating layers 108. The current measuring means 118 may comprise at least one integral amplifier and a current-to-voltage converter, a threshold comparator, and a charge-to-voltage converter for discriminating a logic level in relation to the current measured.

An operation of writing a bit in a storage element of the device 100 of FIG. 1 will now be described.

The column 110, in which the information bit is intended to be stored, is selected by illuminating it by means of the array of light sources 112. In the example in FIG. 1, a light beam 113 is shown, illuminating one of the columns 110. One of the memory layers 106.1 to 106.3 in which it is wished to write a bit is then selected by the selection means 115. When the required memory layer 106 is biased, with respect to the electrically conductive layer 120 (the potential applied to the other memory layers being for example similar to the potential of the electrically conductive layer 120, for example zero), and a light pulse is emitted in the column 110, thus making it electrically conductive throughout the light pulse, a current flows from said memory layer 106 to the electrically conductive layers 120 through the column 110. In a variant, and according to the various potentials applied, the current might also flow from the electrically conductive layer 120 to the memory layer 106 selected. The memory layer 106 therefore also serves as an electrode during an operation of reading or writing in a storage element of the device. In addition, by arranging the electrically conductive layer 120 above the stack of memory layers 106 and dielectric layers 108, this layer 120 is therefore situated as close as possible to the most illuminated zone of the column 110, thus ensuring better conduction when the current passes.

This current leads to heating by Joule effect, which is concentrated in the vicinity of the column 110, at the memory layer 106, since it is at this place that the current density is strongest. On the ring of this interface, if the current is sufficient, the phase-change material of the memory layer is then raised to a temperature above its melting point (for example 650° C. for a memory layer based on GeSbTe) so that, during abrupt cooling, such as a stoppage of the passage of current due to stoppage of the illumination of the column 110 or cancellation of the voltage, the phase-change material, initially in the crystalline state, is put locally in an amorphous state, of low conductivity. A ring, or annular portion, of amorphous material is thus formed around the column 110 and constitutes the physical form of the information bit written. The material in the amorphous state being less conductive, this will henceforth limit the passage of current between the conductive layer 120 and the memory layer 106 comprising the annular portion of material in the amorphous state.

The photoconductive material confers to the columns 110 an optically controlled transistor behaviour. The channel of this transistor, which would be formed by the illuminated column 110, begins to conduct under the process of creating electron-hole pairs, assisted by the presence of a potential difference between the electrically conductive layer 120 and the memory layer selected at the point where a current passes through these elements.

The thermal power allowing the change in state of the material of the memory layer selected, during the writing phase, is linked to the electrical power (Joule effect) developed by the memory layer selection means. This power is higher than that injected optically into the column 110 in order to demand the conduction of this column 110. The optical power necessary for the functioning of this device is therefore much less than that used by rewritable optical discs in which the optical illumination means serve for writing data.

The information may then be reread by the means 118 for measuring the current flowing between the conductive layer 120 and the memory layer 106 selected. For this purpose, the memory layer 106 concerned is biased with respect to the conductive layer 120 at a sufficiently low voltage not to risk reheating the material to the point of making it recrystallised. It is then possible to deduce from the current measured (which is proportional to the resistance presented by the annular portion whose state it is wished to know) whether or not an annular portion of amorphous material is present around the column 110, at the memory layer selected.

The conduction state of the memory layer depends on the size of the annular amorphous zone. Thus it is possible to code the information in binary form or in the form of bits consisting of several levels (discretised bits) in a single memory layer and around a single column 110, the possible size of the amorphous zone depending on the power of the Joule effect during writing (active parameter) and the thermal conductivity of the material of the columns. By varying the size of the annular amorphous zone, by acting on the voltage level between the injection electrode and the memory layer, it is then possible to code the information in "multi-level" form by cells, thus increasing accordingly the capacity of the memory. Each memory point can in this case store several information bits, the number of these bits depending on the number of distinct states than can be produced at a single annular portion of the phase-change material.

The deletion of information at the crossing of a column 110 and one of the memory layers 106.1 to 106.3 takes place with a higher current than that used for reading and writing information, and for a sufficient length of time (for example between approximately 50 ns and 500 ns) to allow heating to the crystallisation temperature and the return of the volume of the annular portion of amorphous material to the crystalline state, by raising it to a so-called "crystallisation" temperature, for example above approximately 170° C. for GeSbTe, for example approximately 400° C.

It is possible to optimise the access time in reading or writing to the storage device 100 by grouping together the information in words of for example 8, 16 or 32 bits, each word being written in all or several of the memory layers 106, at a single column 110. The number of storage levels of the columns, that is to say the number of memory layers 106 that the storage device 100 can have, may therefore be adapted according to the required size of the information words written or read.

The temporal form of the light pulse may also be optimised by electronics controlling the array of light sources 112 according to the operation performed, with for example a steeper extinction edge for a writing operation effecting a tempering of the phase-change material (with for example an extinction edge less than or equal to approximately 50 ns) than for a reading operation or an operation effecting a recrystallisation of the phase-change material (with for example an extinction edge equal to or greater than approximately 100 ns).

A data storage device 200 according to a second embodiment will now be described in relation to FIG. 2.

The device 200 comprises the electrically conductive layer 120, which may be disposed above or below the stack of memory layers 106.1 to 106.3 and insulating layers 108. Compared with the first embodiment, the device 200 also has a structure of photodiodes disposed at the interfaces with the memory layers 106.1 to 106.3 and formed by the photoconductive columns 110 themselves. In this second embodiment, each photoconductive column 110 comprises walls 103 in contact with the layers 106 and 108 of the stack, formed by a first layer based on a semiconductor with a first conductivity type, and a central part 105 based on a semiconductor with conductivity complementary to that of the first layer 103. The photodiodes formed by the columns 110 are therefore here of the type with two semiconductors complementary in doping. In a variant, when the central part 105 of the columns is based on a metal material, the photodiodes formed by the photoconductive columns 110 are then of the Schottky type. Thus, when the light passes through the column 110 chosen, the photodiode formed at the interface of this column and of the correctly biased memory layer 106 photogenerates charge carriers that pass through the biased memory layer, thus performing the operation of reading, writing or deleting data at the annular portion of the memory layer selected situated around the illuminated column 110.

In addition, compared with the device 100 according to the first embodiment, the device 200 comprises a stack of layers 202 forming a "mirror" structure for example of the λ/4 type. Thus the light issuing from the array of light sources 112 is reflected at least partly in the columns 110, thus reinforcing the light field in the columns 110. In general terms, this light reflection may be achieved by means of at least one optically reflective layer disposed opposite the columns 110 and the light source illuminating the columns.

Finally, the device 200 also comprises a protective layer 206 formed above the stack of memory layers 106 and insulating layers 108, and the top of the columns 110. This protective layer is for example based on diamond carbon and/or plastic.

A method of producing the storage device will now be described in relation to FIGS. 3A to 3E.

Figure 3A:
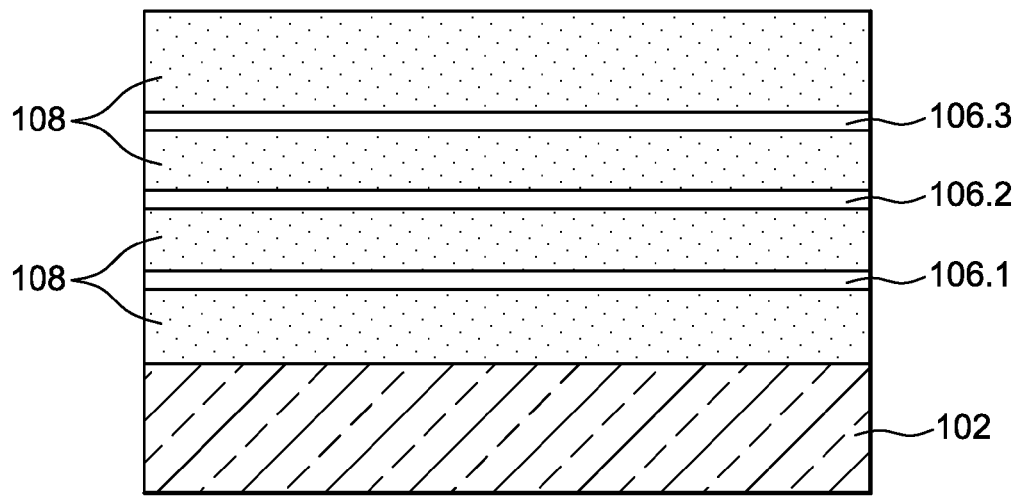
FIGS. 3A to 3E show the steps of a method of producing a data storage device according to the first embodiment.

As shown in FIG. 3A, there is first of all produced, on the substrate 102, a stack formed from the insulating layers 108 and memory layers 106.1 to 106.3. These insulating layers 108 and memory layers 106.1 to 106.3 may for example be produced by successive depositions of the same nature, such as PVD depositions (physical vapour deposition). The substrate 102 may also comprise, before the production of the stack, a technological layer comprising for example the current-measuring means 118 shown in FIG. 1.

In addition, when the storage device comprises a stack of layers 202 forming a "mirror" structure, this may be produced on the substrate 102 prior to the first deposition of the first insulating layer 108.

It is possible to produce, between one or more steps of deposition of a layer of the stack (insulating or memory layer), a step of mechanical/chemical planing of the layer deposited.

A mechanical protection layer may also be formed above the stack previously produced, for example based on diamond or plastic and with a thickness of between approximately 3 nm and 10 nm when it is based on diamond, and between approximately 10 μm and 200 μm when it is based on plastic.

Preferably, the first layer and the last layer of the stack deposited on the substrate 102 are insulating layers 108.

Figure 3B:
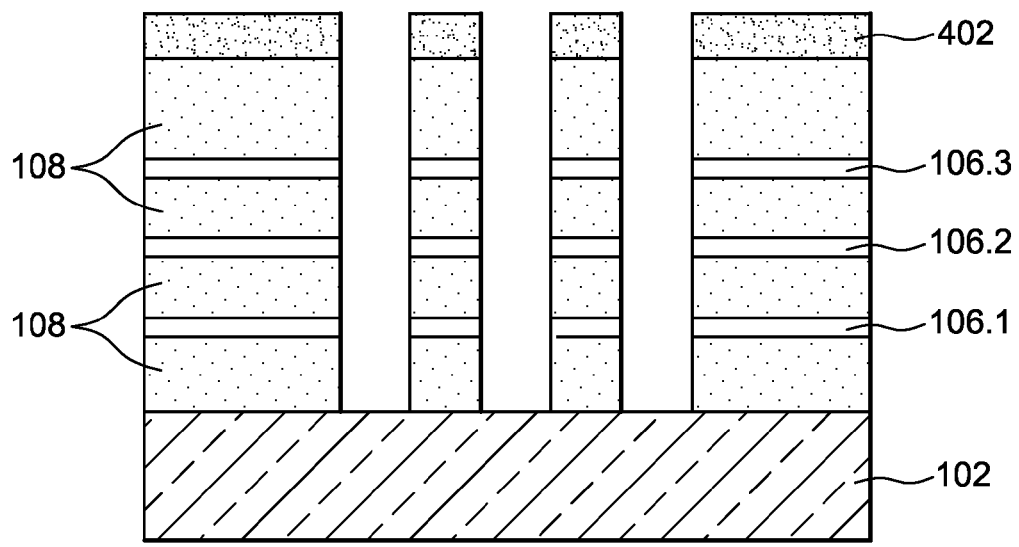

Next the stack is structured by depositing a lithography mask 402 on the stack, and then carrying out etching, for example IBE ion etching, or reactive ion etching (RIE) or ICP ("Induced Coupled Plasma") etching, offering high selectivity of etching, of the stack of insulating layers 108 and memory layers 106.1 to 106.3 (FIG. 3B). This structuring step makes it possible to produce holes, future locations for the columns 110 of the storage device. The mask 402 may for example be a layer of photosensitive resin, insolated through a mask or a layer based on a plastics material and deformed by a moulding process. The mask 402 makes it possible to transfer the pattern defining the location of the columns in the stack and the distribution of the compartments in the stack by an etching process, such as ion etching or reactive ion etching. The mask serving for the insolation of the resin layer or of the mould may advantageously be produced by a deposition of nanoparticles or a mixture of non-miscible constituents. This etching step also makes it possible to make the partitioning of the data storage device into compartments 116.

There is then deposited in a conformal manner, for example by means of a CVD deposition with gaseous or liquid precursors, a photoconductive material, for example based on amorphous silicon or zinc oxide, in the previously etched holes, in order to form the photoconductive columns 110. The photoconductive material may also be organic and in this case be deposited by spin coating or sintering. Photoconductive columns 110 similar to those shown in FIG. 1 are thus produced.

Figure 2:
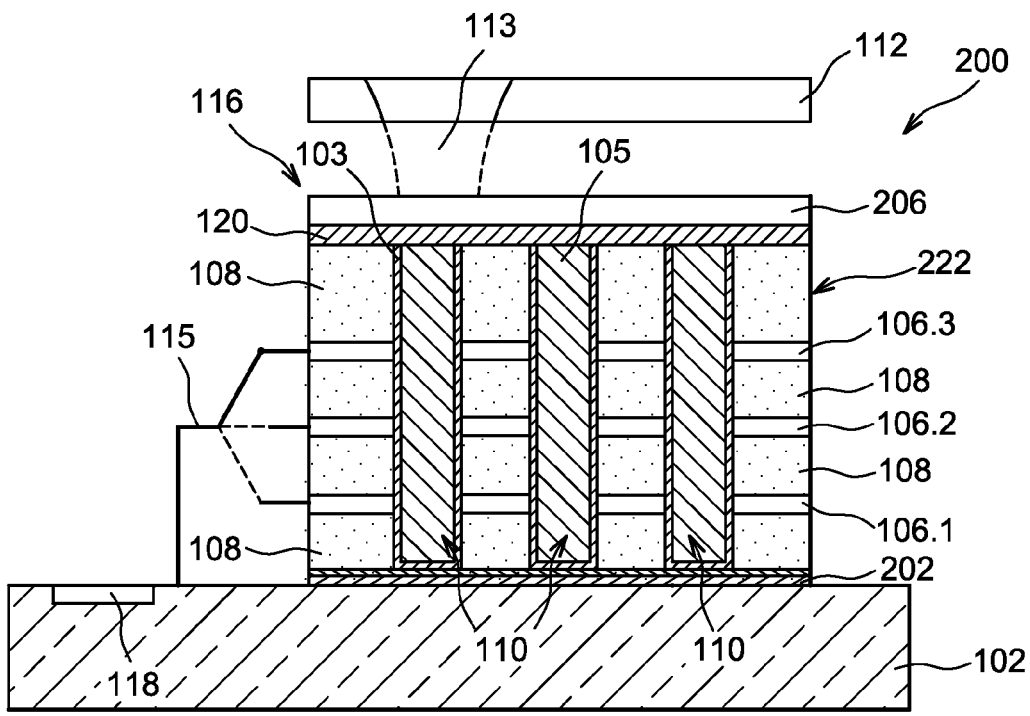
Figure 3C:
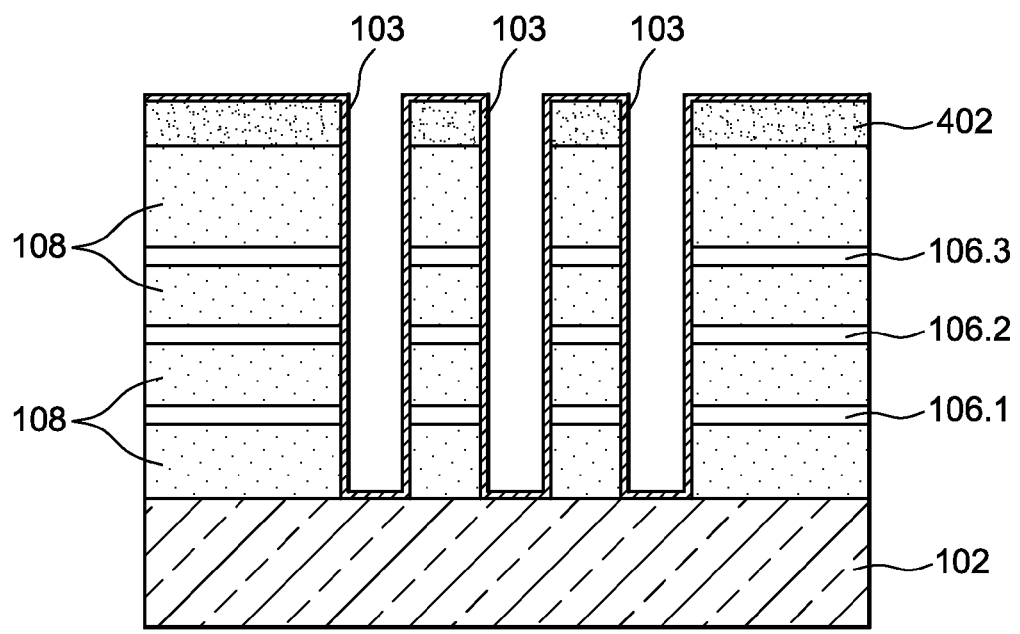
Figure 3D:
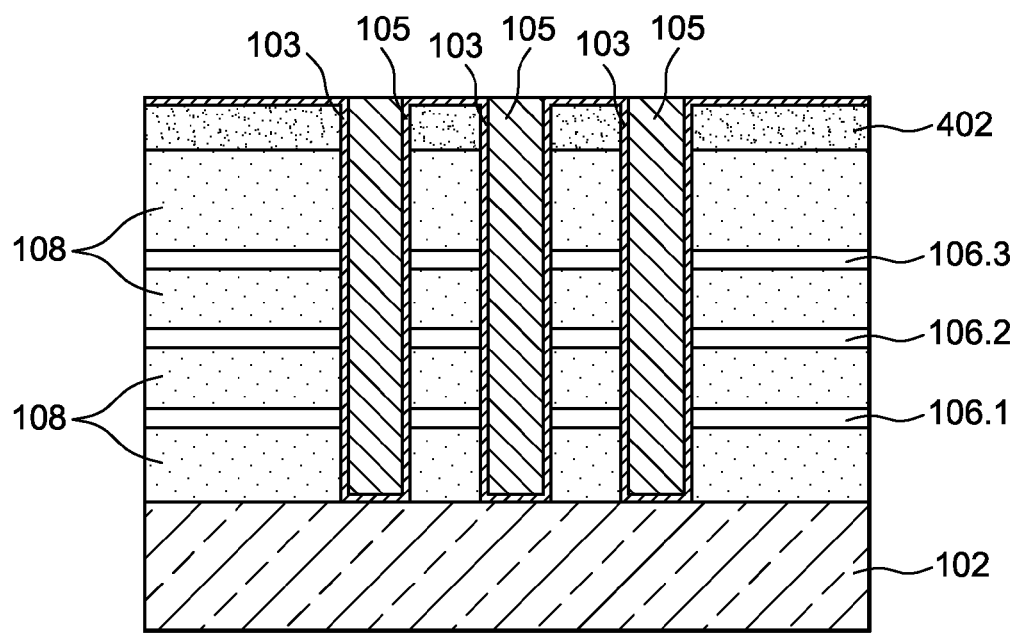
Figure 3E:
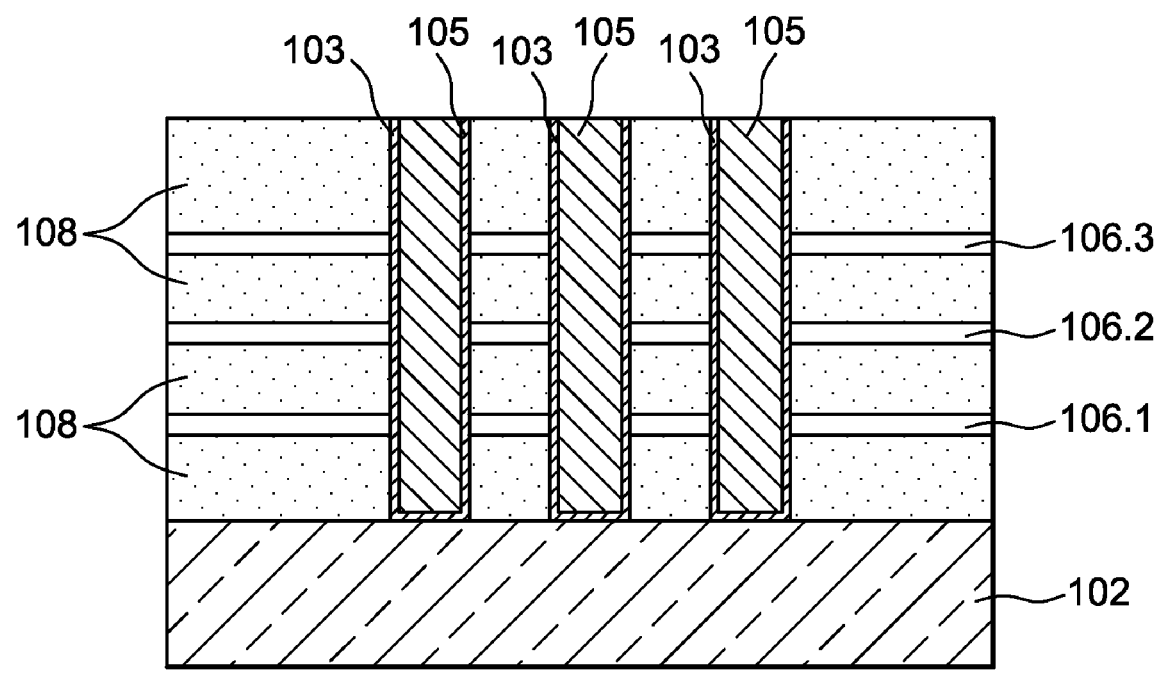

However, on the example in FIGS. 3C to 3E, the columns 110 similar to those shown in FIG. 2 are produced, that is to say comprising a first layer 103 conforming to the walls of the holes and a central part 105. As shown in FIG. 3C, a first conformal deposition is then carried out in the holes, for example a CVD deposition with gaseous or liquid precursors, of a layer 103 of semiconductor of the n or p type. A metal compound 105, or another semiconductor respectively of p or n type, is then deposited in the previously produced holes, on the layer 103, in order to form the columns 110 (see FIG. 3D). The layers 103 and 105 may also be obtained by successive growing of n and p doped layers. Such a structure of photo-diodes may also be obtained by alternating the gases interacting during a CVD or VLS (Vapour-Liquid-Solid) growth in addition to the silane used, such as for example arsine and phosphine, making it possible to make respectively p and n dopings.

As shown in FIG. 3E, there is then effected, for example by a mechanical/chemical polishing of the device, the removal of the mask 402 and the materials of the columns 110 situated on the mask 402. The removal of these materials may also be effected by anisotropic etching, for example of the RIE type.

The electrically conductive layer 120 may then be deposited on the stack of layers and on the top of the columns 110, unless it is already present between the stack of layers 106, 108 and the substrate 102.

The data storage device is then finished by depositing a protective layer, for example similar to the layer 206 shown in FIG. 2, for example based on diamond carbon or plastic.

The structure produced is then coupled to an array of light sources 112 as shown in FIGS. 1 and 2.

Figure 4:
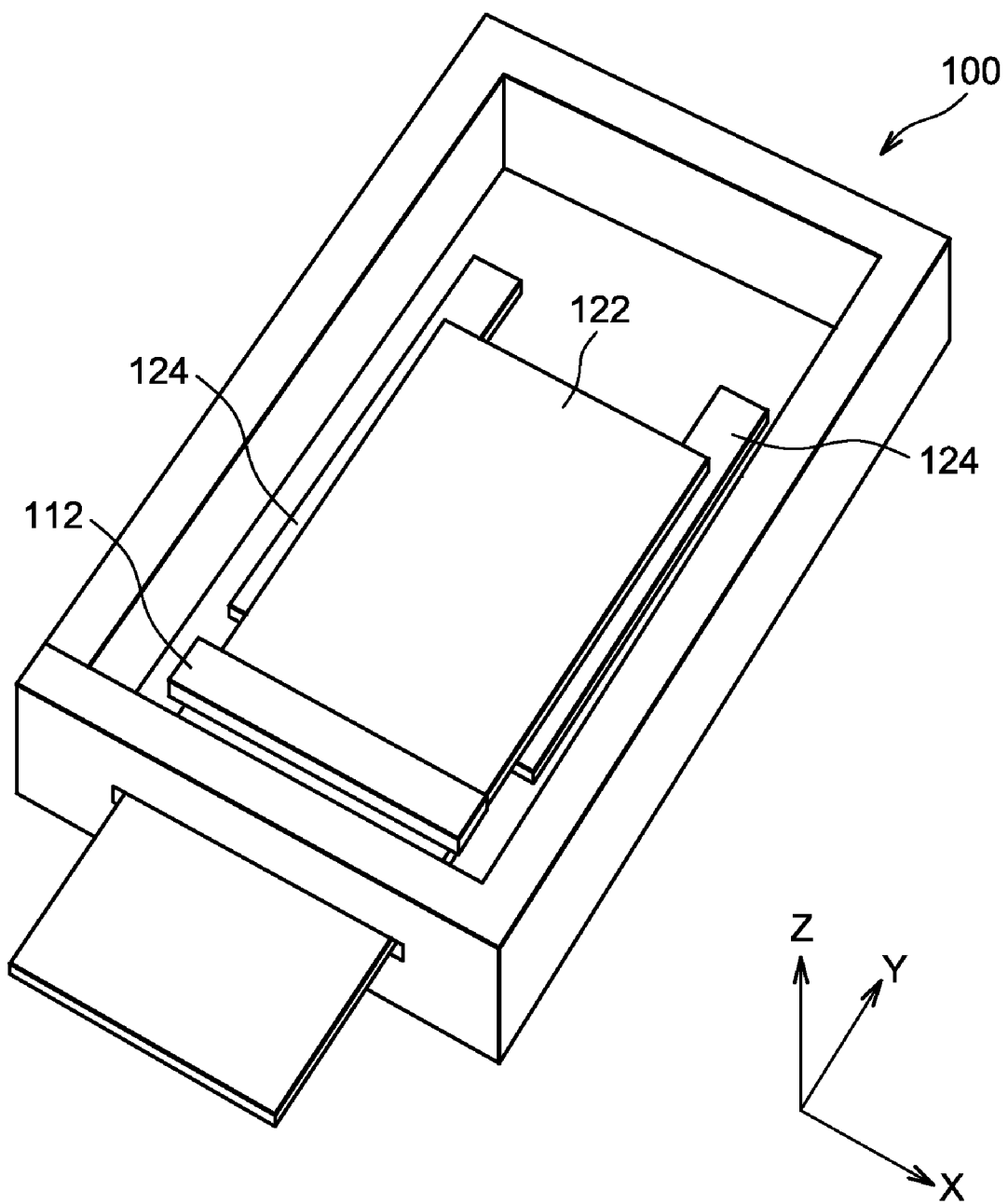
FIG. 4 shows a global schematic view of a data storage device.

FIG. 4 shows a global schematic view of the storage device 100. This comprises the array of optical sources 112 integrated in a system of the MOEMS type able to cover the entire width (the dimension along the x axis) of the storage medium 122, which is here rectangular in shape. This MOEMS system is able to translate the light sources over a travel equal to or greater than the step between the light sources, typically equal to approximately 100 μm along the x axis shown in FIG. 4, with respect to the storage medium 122. The device 100 also comprises motors 124 for moving the storage medium 122 also along the y axis, but over a travel of several centimeters, for example between approximately 1 cm and 10 cm. Thus the entire surface of the storage medium 122 may be exposed under the array of light sources. These motors 124 are for example of the "stick slip" or "piezo walk" or "micro walker" type, that is to say nano-step inertia motors, thus making it possible to obtain a precise movement of the storage medium 122. In addition, the device 100 comprises two motors 124 each moving one side of the storage medium 122. Thus these two motors 124 can adjust the perpendicularity of the movement of the storage medium 122 with the direction of movement of the light sources 112 (along the y axis).

In general terms, the storage device 100 or 200 may also be used in the form of a fixed medium, that is to say without means of moving the storage medium with respect to the array of light source, for example in the form of a disc.

The invention claimed is:

1. A data storage device comprising:
a stack of layers comprising at least one memory layer able to effect a storage of data in a plurality of portions of the memory layer by a modification of at least one physico-chemical property of the material of said portions of the memory layer under the effect of an electric current passing through said portions of the memory layer;
a plurality of photoconductive columns disposed in the stack of layers and passing through each layer in this stack;
each of said portions of the memory layer surrounding one of the photoconductive columns; and
a plurality of light sources able to illuminate said plurality of photoconductive columns.

2. The data storage device according to claim 1, in which said portions of the memory layer are annular in shape.

3. The data storage device according to claim 1, in which said memory layer is based on at least one phase-change material, and/or the photoconductive columns are based on at least one photoconductive material such as undoped silicon and/or zinc oxide and/or indium antimonide and/or an alloy of tellurium antimony germanium $Ge_xSb_yTe_z$ and/or an organic photoconductive material, and/or the columns comprise at least two layers of semiconductor with complementary conductivities, or a layer of doped semiconductor and a metal layer.

4. The data storage device according to claim 1, in which the stack of layers is formed by an alternation of insulating layers and memory layers.

5. The data storage device according to claim 1, also comprising a plurality of trenches produced in the stack of layers and passing through all the layers in the stack, forming several portions, electrically insulated from one another, of the stack of layers and photoconductive columns.

6. The data storage device according to claim 1, also comprising at least one electrically conductive layer disposed against the stack of layers and against the top or base of the photoconductive columns.

7. The data storage device according to claim 1, also comprising means of applying voltage to the terminals of the memory layer, and/or means of selecting one or more photoconductive columns and/or means of selecting one or more memory layers, and/or means of measuring current flowing in one or more memory layers.

8. The data storage device according to claim 1, also comprising at least one optically reflective layer and/or at least one protection layer formed against the stack of layers.

9. The data storage device according to claim 1, in which the plurality of light sources comprises an array of optical sources of the VCSEL type.

10. The data storage device according to claim 1, in which at least the stack of layers and the photoconductive columns form a storage medium able to move with respect to the plurality of light sources, and comprising means for relatively moving the storage medium with respect to the plurality of light sources.

11. The data storage device according to claim 10, in which the plurality of light sources are disposed in a system of the MOEMS type able to translate the light sources with respect to the storage medium, and/or the means for relatively moving the storage medium with respect to the plurality of light sources comprise at least one motor of the MEMS type.

12. A method of producing a data storage device, comprising at least the steps of:
producing a stack of layers comprising at least one memory layer able to implement a data storage in a plurality of portions of the memory layer by a modification of at least one physico-chemical property of the material of said portions of the memory layer under the effect of an electric current passing through said portions of the memory layer;
etching a plurality of holes in the stack of layers, the holes passing through each layer in the stack;
producing photoconductive columns in the holes, each of said portions of the memory layer surrounding one of the photoconductive columns; and producing a plurality of light sources able to illuminate the plurality of photoconductive columns.

13. The method according to claim 12, in which the production of the stack of layers is obtained by steps of alternating depositions of insulating layers and memory layers.

14. The method according to claim 12, in which the step of producing photoconductive columns comprises a step of filling holes by at least one photoconductive material, or a first conformal deposition at the walls of the holes of a first layer based on a doped semiconductor with a first conductivity type and a second step of deposition of a doped semiconductor of a second conductivity type opposite to the first conductivity type or of an electrically conductive material on the first layer.

15. The method according to claim 12, also comprising, after the step of producing the photoconductive columns, a step of deposition of an electrically conductive layer and/or a mechanical protection layer on the stack of layers and on the photoconductive columns.

16. The method according to claim 12, also comprising, before the step of producing the stack of layers, a step of depositing an electrically conductive layer and/or at least one optically reflective layer against a substrate, the stack of layers being produced on the electrically conductive layer and/or on the optically reflective layer.

* * * * *